US012757781B2

(12) United States Patent
Xie et al.

(10) Patent No.: US 12,757,781 B2
(45) Date of Patent: Oct. 6, 2026

(54) PATTERNED SHEET MUF FOR COMPLEX PACKAGES AND METHODS OF PRODUCING

(71) Applicant: Intel Corporation, Santa Clara, CA (US)

(72) Inventors: Zhixin Xie, Chandler, AZ (US); Jung Kyu Han, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 18/091,034

(22) Filed: Dec. 29, 2022

(65) Prior Publication Data

US 2024/0222216 A1 Jul. 4, 2024

(51) Int. Cl.

| | |
|---|---|
| ***H10W 74/10*** | (2026.01) |
| ***G02B 6/42*** | (2006.01) |
| ***H10W 74/01*** | (2026.01) |
| ***H10W 74/15*** | (2026.01) |
| ***H10W 74/47*** | (2026.01) |
| ***H10W 90/00*** | (2026.01) |
| *H10W 72/00* | (2026.01) |
| *H10W 72/20* | (2026.01) |
| *H10W 72/30* | (2026.01) |

(Continued)

(52) U.S. Cl.

CPC ........ *H10W 74/121* (2026.01); *G02B 6/4239* (2013.01); *H10W 74/012* (2026.01); *H10W 74/016* (2026.01); *H10W 74/15* (2026.01); *H10W 74/473* (2026.01); *H10W 90/00* (2026.01); *H10W 72/07252* (2026.01); *H10W 72/07352* (2026.01); *H10W 72/07353* (2026.01); *H10W 72/221* (2026.01); *H10W 72/321* (2026.01); *H10W 72/332* (2026.01); *H10W 72/334* (2026.01); *H10W 74/00* (2026.01); *H10W 74/10* (2026.01); *H10W 74/40* (2026.01); *H10W 90/724* (2026.01); *H10W 90/734* (2026.01)

(58) Field of Classification Search

CPC H10W 74/121; H10W 74/012; H10W 74/016

See application file for complete search history.

(56) References Cited

U.S. PATENT DOCUMENTS

| | | | | |
|---|---|---|---|---|
| 2021/0035859 | A1* | 2/2021 | Mehta | H01L 23/562 |
| 2021/0193542 | A1* | 6/2021 | Chang | H01L 23/3128 |

OTHER PUBLICATIONS

Joshi, et al. "Molded Underfill (MUF) Technology for Flip Chip Packages in Mobile Applications", IEEE, 2010 Electronic Components and Technology Conference, 8 pgs.

(Continued)

*Primary Examiner* — Errol V Fernandes

(74) *Attorney, Agent, or Firm* — Schwabe, Williamson & Wyatt P.C.

(57) ABSTRACT

Embodiments disclosed herein include electronic packages. In an embodiment, the electronic package comprises a package substrate with a die coupled to the package substrate by a plurality of interconnects. In an embodiment, a first layer is on the package substrate surrounding the die, and a second layer is over and around the die. In an embodiment, the second layer underfills the plurality of interconnects, and the second layer has a different material composition than the first layer.

20 Claims, 10 Drawing Sheets

(51) Int. Cl.
*H10W 74/00* (2026.01)
*H10W 74/40* (2026.01)

(56) References Cited

OTHER PUBLICATIONS

Ng, et al., "Underfill Flow in Flip-Chip Encapsulation Process: A Review", Journal of Electronic Packaging, Mar. 2022, vol. 144, 010803-1, 19 pgs.

* cited by examiner

PATTERNED SHEET MUF FOR COMPLEX PACKAGES AND METHODS OF PRODUCING

TECHNICAL FIELD

Embodiments of the present disclosure relate to electronic packages, and more particularly to electronic packages that are overmolded and undermolded with a hybrid mold underfill (MUF).

BACKGROUND

In panel and wafer level high-density advanced packaging solutions, underfill solutions are limited. In many cases, a capillary underfill (CUF) is applied around the solder interconnects between a die and a package substrate. The CUF provides mechanical support to the solder interconnects and improves reliability of the package. However, due to the unit-to-unit dispensing and inherent capillary flow characteristics, CUF has a relatively low throughput and high assembly costs. CUF solutions are one of the slowest processes in the package assembly work flow.

In some instances a mold underfill (MUF) can be used to underfill the die and provide an overmold compound in a single combined operation. This process greatly reduces the molding time. In addition, MUF processes tend to be lower in cost due to less expensive ingredients, such as epoxy resins and hardeners. Among the different types of MUF materials, sheet MUF is one typical type of MUF. Sheet MUF benefits from controllable thickness and lower total thickness variation (TTV). Since sheet MUF does not require a dispensing step (unlike granule or liquid solutions), more time is saved during the molding process.

However, MUF materials are limited by a relatively narrow scope to encompass a wide range of die and package sizes. Although promising, MUF is not widely adopted in industry since the material properties have not reached parity with CUF materials. This is particularly evident in fine pitch and high bump density applications. With the increase of packaging complexity, such as smaller bump pitch, different ways of stacking dies, and co-packaging of electrical and optical integrated circuits, using a single MUF material is facing even more challenges to meet all comprehensive requirements (e.g., low warpage, void free, optically transparent, etc.). For example, a high filler loading MUF will help control warpage, but is not effective at underfilling fine bump pitches. On the other hand, a low filler MUF will have higher coefficient of thermal expansion (CTE) and lead to warpage and residual stress.

EMBODIMENTS OF THE PRESENT DISCLOSURE

Described herein are electronic packages that are overmolded and undermolded with a hybrid mold underfill (MUF), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
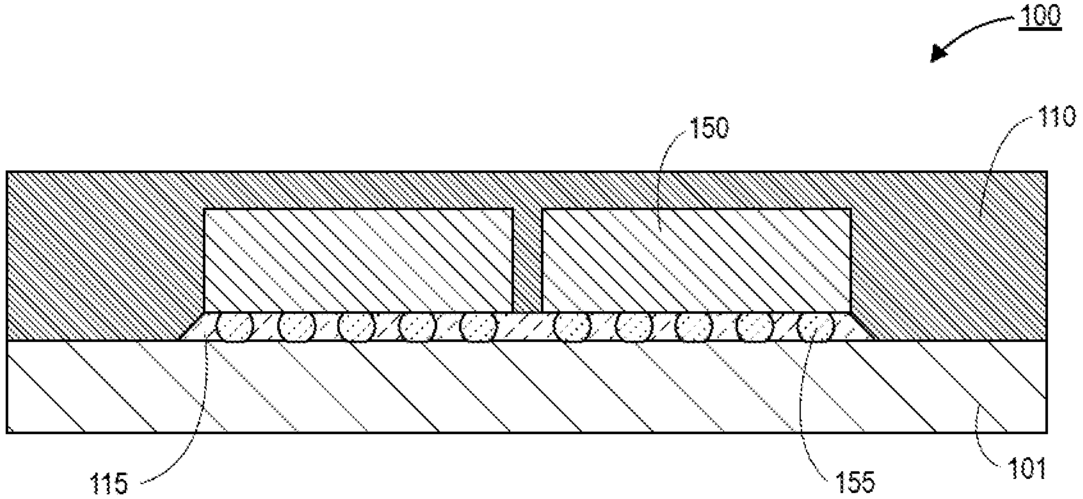
FIG. 1A is a cross-sectional illustration of an electronic package that uses a conventional capillary underfill material between the dies and the package substrate and an overmolding material.

As noted above, the ability to properly underfill a die is important, especially for advanced packaging architectures that include small bumps and fine bump pitch. Traditionally, the fine bump pitch and small size of bumps is accounted for through the use of a capillary underfill (CUF) material. An example of such a solution is shown in FIG. 1A. As shown, one or more dies 150 may be attached to a package substrate 101 through interconnects 155, such as solder bumps, copper pads, or the like. In an embodiment, the CUF 115 is dispensed at the side of the dies 150 and capillary forces draw the CUF 115 underneath the dies 150 so that the CUF 115 surrounds the interconnects 155. After underfilling, a mold material 110 may be applied over the electronic package 100. The mold material 110 may be a material composition that is tuned for reducing warpage in the system. For example, the mold material 110 may have a high filler content in order to reduce the coefficient of thermal expansion (CTE). That is, whereas the CUF 115 is tuned for underfilling, the mold material 110 is tuned for CTE and other mechanical properties. As such, two different material compositions are needed for the CUF 115 and the mold material 110.

Figure 1B:
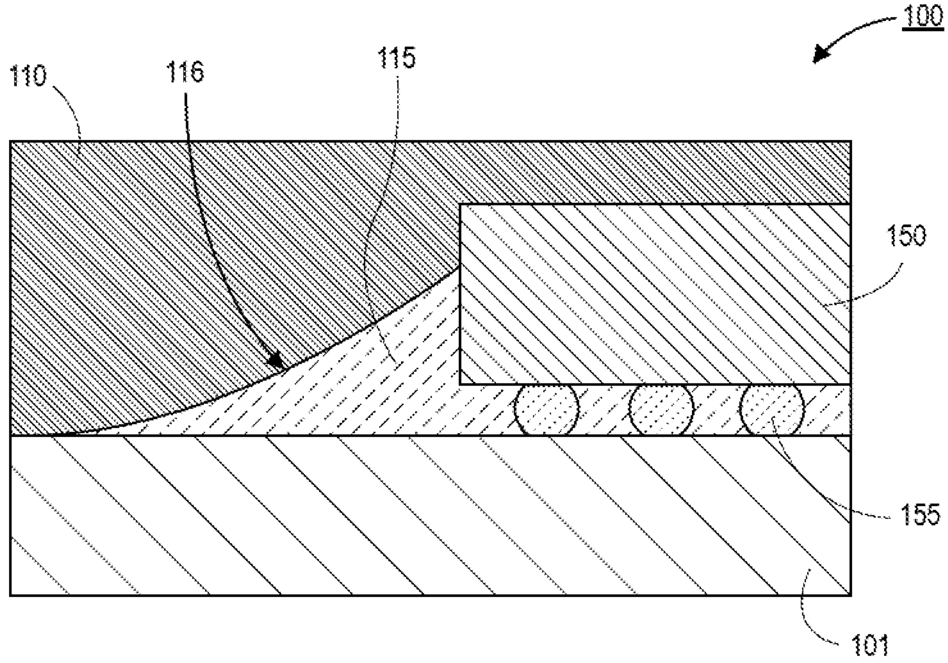
FIG. 1B is a zoomed in illustration of the electronic package in FIG. 1A that illustrates the fillet along the side of the capillary underfill material.

Referring now to FIG. 1B, a zoomed in cross-sectional illustration of the electronic package 100 is shown. Particularly, the edge of the die 150 is illustrated. This view depicts a traditional edge profile 116 of the CUF 115. The edge profile 116 is usually a fillet shape that starts at the top surface of the package substrate 101 and curves up to the sidewall of the die 150. This fillet shaped edge profile 116 is generally present when there is a two material system in order to underfill and overmold the electronic package.

As noted above such CUF 115 solutions may be necessary for high density bump architectures. However, the CUF 115 solution leaves a lot to be desired. For example, the CUF 115 dispensing process requires dispensing nozzles, keep out zones, and the like. Further, the dispensing process is a relatively slow process. In some instances, the CUF 115 dispensing is the most time consuming operation in the package assembly process. Accordingly, it is desirable to find an alternative to CUF 115 material systems.

Figure 2A:
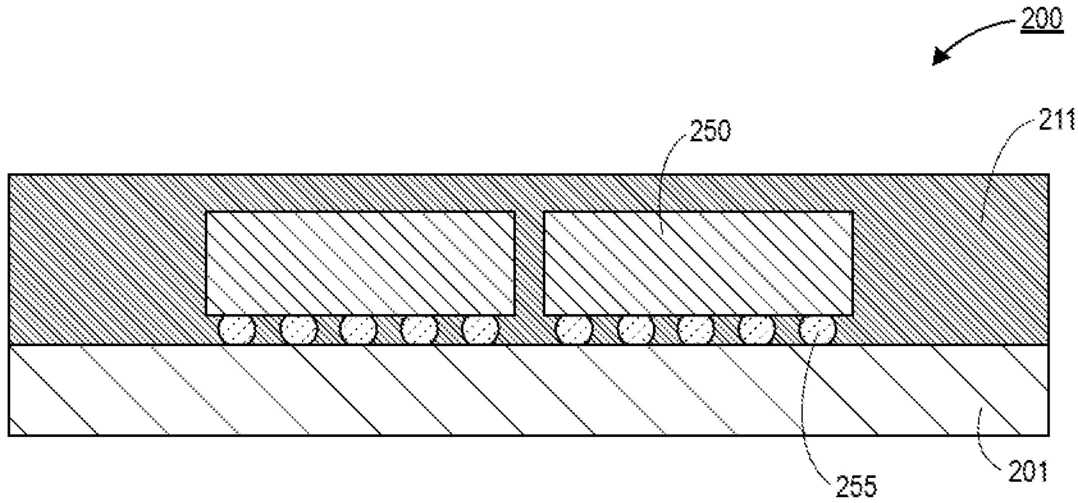
FIG. 2A is a cross-sectional illustration of an electronic package that uses a mold underfill (MUF) solution to overmold and underfill the electronic package.

One solution for replacing CUF material systems is to use a mold underfill (MUF) material. An example of such a solution is shown in FIG. 2A. As shown, the electronic package 200 includes a package substrate 201. One or more dies 250 are coupled to the package substrate 201 by interconnects 255, such as solder balls, copper bumps, or the like. Instead of having a dual material system of an overmolding material and a CUF, the electronic package 200 includes a MUF 211. The MUF 211 surrounds the interconnects 255 as well as provides warpage mitigation along the surface of the package substrate 201.

Therefore, the MUF 211 needs to strike a balance between competing material properties. Particularly, a good flow property is needed in order to flow the MUF 211 under the dies 250 and around the interconnects 255, while also providing a low CTE to mitigate warpage of the electronic package. Low CTE is provided by increasing the filler loading percentage. However, this negatively impacts the flow of the MUF 211 between the interconnects 255. Accordingly, MUF materials must undergo an intensive design of experiment (DOE) to find a suitable formulation for a given electronic package. This additional development time, (with the addition of complex ingredients) makes the cost benefit of such MUF 211 systems less prominent, especially in large form factor packaging.

Figure 2B:
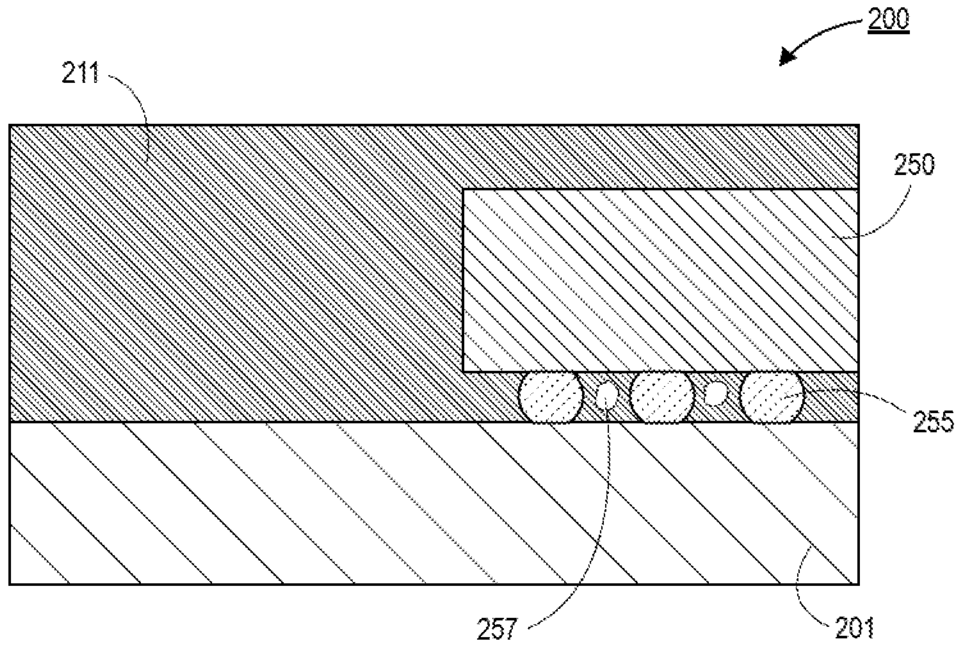
FIG. 2B is a zoomed in illustration of the electronic package in FIG. 2A that illustrates the formation of voids between interconnects when using a MUF solution.

For example, a drawback of such MUF 211 systems is shown in the zoomed in cross-sectional illustration shown in FIG. 2B. The MUF 211 may be a single material that covers the die 250 and surrounds the interconnects 255. However, maintaining low CTE results in less than ideal viscosity. This may result in the formation of voids 257 between the interconnects 255. The voids 257 are air gaps that are provided below the dies 250. Voids 257 can lead to reliability issues.

Accordingly, embodiments disclosed herein include a hybrid MUF system. In a hybrid MUF system at least two different mold materials are provided in the MUF sheet. A first mold material may include a material composition that provides a low CTE. A second mold material may include a material composition that has a viscosity that is able to fully embed the interconnects between the die and the package substrate. The second mold material may be formulated to provide complete underfilling even when the interconnects are small and have a fine pitch.

In an embodiment, the second mold material may fill holes or cavities that are provided in the first mold material. For example, holes through an entire thickness of the first mold material may be filled with the second mold material. The holes may be located so that they overlap the dies or other components that need underfilling. In some instances the interface between the first mold material and the second mold material may be substantially vertical. This is in contrast to existing CUF systems that include a fillet shaped interface between the CUF and the overmolding compound. As used herein, "substantially vertical" may refer to a plane that is orthogonal to the top surface of the package substrate. Though, a "substantially vertical" interface may also include surfaces angled slightly away from being orthogonal to the top surface of the package substrate. A slightly tapered interface may be used in order to provide a draft to accommodate an imprinting tool used to form the holes in the first mold material.

In addition to providing different viscosities, embodiments may include a first mold material and a second mold material that have different optical properties. For example, it may be desirable to include a second mold material that is optically clear compared to a first mold material that is opaque. An optically clear second mold material may be particularly beneficial for co-packaged solutions that include both an electronics integrated circuit (EIC) and a photonics integrated circuit (PIC). An optically clear second mold material allows for optical signals to/from the PIC to be transmitted through the second mold material to optical routing within the package substrate. Since the remainder of the electronic package does not need optical transparency, an opaque molding material with better mechanical properties may be used for the first mold material.

In certain embodiments, the structures described may include the entire electronic package. That is, the integration of a hybrid MUF sheet into an electronic package is described herein. In other embodiments, the hybrid MUF sheet in isolation is described. That is, the hybrid MUF sheet itself is a novel improvement over existing single material MUF sheets.

Embodiments disclosed herein also include methods of forming hybrid MUF sheets. In one embodiment, a hybrid MUF sheet may be formed with an embossing process. In such an embodiment, the first mold material is dispensed in a frame. The first mold material is then embossed with a pattern to form openings in the first mold material. A second mold material is then dispensed into the openings to form a hybrid MUF sheet.

In other embodiments, a roll-to-roll manufacturing process is provided. In such an embodiment, the first mold material is passed through a first roller with a pattern that embosses the first mold material. Dispensing of the second mold material is done after the first roller, and the system passes through a second roller in order to provide a flat sheet with the second mold material filling the holes in the first mold material.

Figure 3:
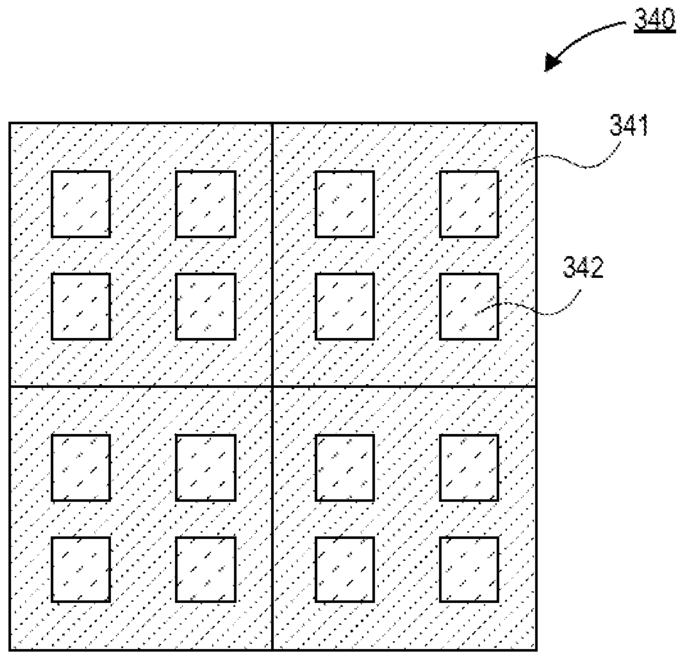
FIG. 3 is a plan view illustration of a hybrid MUF sheet with a first mold material and islands of a second mold material with a different composition than the first mold material, in accordance with an embodiment.

Referring now to FIG. 3, a plan view illustration of a hybrid MUF sheet 340 is shown, in accordance with an embodiment. In an embodiment, the hybrid MUF sheet 340 may have any suitable form factor. For example, as shown in FIG. 3, the hybrid MUF sheet 340 is a panel level sheet with four quadrants. Though, it is to be appreciated that the hybrid MUF sheet 340 may be provided in a quarter panel form factor, a roll-to-roll form factor, or the like. In some embodiments, the hybrid MUF sheet 340 may be a wafer level form factor.

In an embodiment, the hybrid MUF sheet 340 may comprise a first mold material 341 and a second mold material 342. The first mold material 341 may have a different material composition than the second mold material 342. For example, the first mold material 341 may have a lower CTE than the second mold material 342. This allows for warpage reduction while still enabling low viscosity around and under the die with the second mold material 342. Changes in CTE and viscosity may be attributable, at least in part, to differences in filler loading. For example, the first mold material 341 may have a first filler loading, and the second mold material 342 may have a second, lower, filler loading. In an embodiment, the material composition of the first mold material 341 may be different than the material composition of the second mold material 342 with respect to one or more of filler size, filler loading, filler type, filler shape, filler hollow ratio, resin type, and additives.

In the illustrated embodiment, the second mold material 342 is provided in a sequence of islands that are surrounded by the first mold material 341. In the illustrated embodiment, each quarter-panel section includes a set of four islands of the second mold material 342. Though, it is to be appreciated that any number of islands of the second mold material 342 may be provided. Additionally, while shown as being similar to each other, the second mold material 342 islands may have different shapes and/or sizes. The second mold material 342 islands may also be positioned in any location within the first mold material 341. Further, while shown as having a first mold material 341 and a plurality of second mold materials 342, it is to be appreciated that the hybrid MUF sheet 340 may include any number of different mold material compositions, as will be described in greater detail below.

As used herein, "mold materials" may also be referred to as "mold layers" or simply "layers". A mold material is generally an epoxy based material (with or without fillers, additives, etc.) that is capable of being molded over one or more structures (e.g., dies). Though it is to be appreciated that other material systems may have similar functionality and be considered a mold layer. In some embodiments disclosed herein, two different mold layers are integrated with each other in a sheet configuration in order to provide the hybrid MUF systems.

Figure 4A:
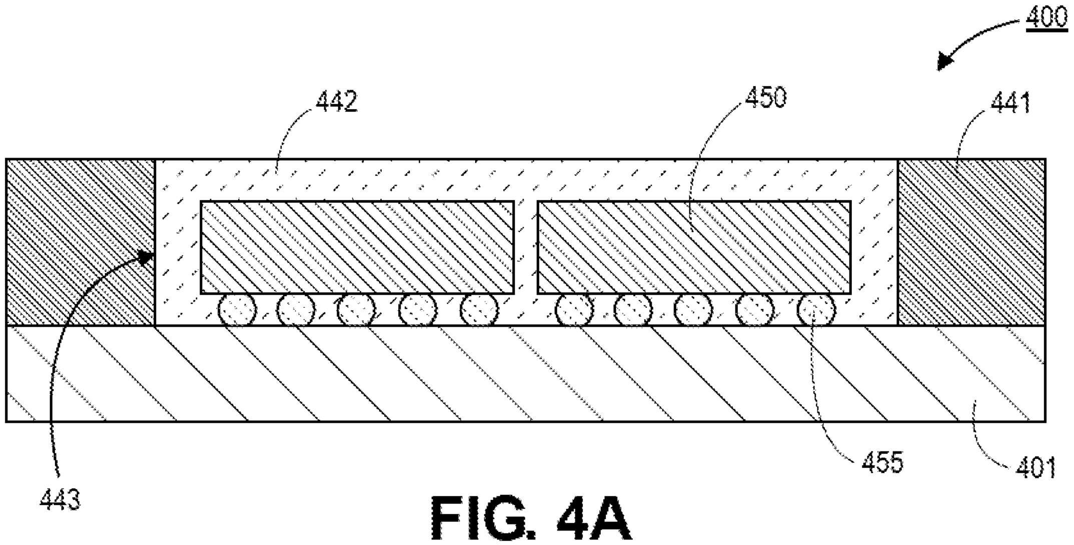
FIG. 4A is a cross-sectional illustration of an electronic package that comprises a MUF sheet with a first mold material and a second mold material that surrounds the dies, in accordance with an embodiment.

Referring now to FIG. 4A, a cross-sectional illustration of an electronic package 400 is shown, in accordance with an embodiment. In an embodiment, the electronic package 400 may comprise a package substrate 401. The package substrate 401 may be a cored substrate (e.g., glass core, organic core, etc.). The package substrate 401 may alternatively be coreless in some embodiments. Dielectric buildup layers (e.g., buildup film) may be provided in the package substrate 401. Conductive routing (not shown for simplicity) may be provided within the package substrate 401.

While a structure with a package substrate 401 is shown, it is to be appreciated that there may also be an interposer or the like between the dies 450 and the package substrate 401. For example, a glass interposer, a silicon interposer, or the like may be provided between the dies 450 and the package substrate 401. In such embodiments, the overlying hybrid MUF sheet may be provided over the interposer instead of (or in addition to) over the package substrate 401.

In an embodiment, one or more dies 450 may be provided over the package substrate 401. The dies 450 may be compute dies, memory dies, or the like. For example, the dies 450 may include a central processing unit (CPU), a graphics processing unit (GPU), an XPU, a system on a chip (SoC), an application specific integrated circuit (ASIC), a communications die (e.g., a PIC), or the like. In some embodiments, two or more dies 450 may be coupled together through an embedded bridge (not shown) provided within the package substrate 401.

In an embodiment, the dies 450 may be coupled to the package substrate 401 through interconnects 455. While shown as solder balls in FIG. 4A, it is to be appreciated that any interconnect architecture may be used to couple the package substrate 401 to the dies 450. In some instances, the interconnects 455 may be referred to as first level interconnects (FLIs). FLIs may include solder bumps, copper bumps, and the like. In an embodiment, the interconnects 455 may have a dimension of approximately 50 μm or less, approximately 25 μm or less, or approximately 10 μm or less. The interconnects 455 may include a pitch of approximately 50 μm or less, approximately 15 μm or less, or approximately 5 μm or less.

In an embodiment, a hybrid MUF sheet may be applied over the package substrate 401 and the dies 450. The hybrid MUF sheet may include a first mold material 441 and a second mold material 442. The first mold material 441 may have a different material composition than the second mold material 442. For example, the first mold material 441 may have a lower CTE than the second mold material 442, and/or the first mold material 441 may have a higher viscosity than the second mold material 442.

The second mold material 442 may be localized over the one or more dies 450. Particularly, the material properties of the second mold material 442 are provided in order to improve underfilling of the dies 450. For example, a low viscosity (e.g., low filler loading) material will provided improved flow around the interconnects 455 in order to underfill without leaving voids. The second mold material 442 may also be provided over a top surface of the one or more dies 450. From a top down view, both the first mold material 441 and the second mold material 442 may be visible in some embodiments.

In an embodiment, the interface 443 between the first mold material 441 and the second mold material 442 is substantially vertical. This is distinct from existing CUF solutions that exhibit a fillet interface between the CUF and the molding material. Here, the substantially vertically oriented interface is the result of an embossing step that forms an opening within the first mold material 441. The opening is then filled with the second mold material 442, as will be described in greater detail below.

Figure 4B:
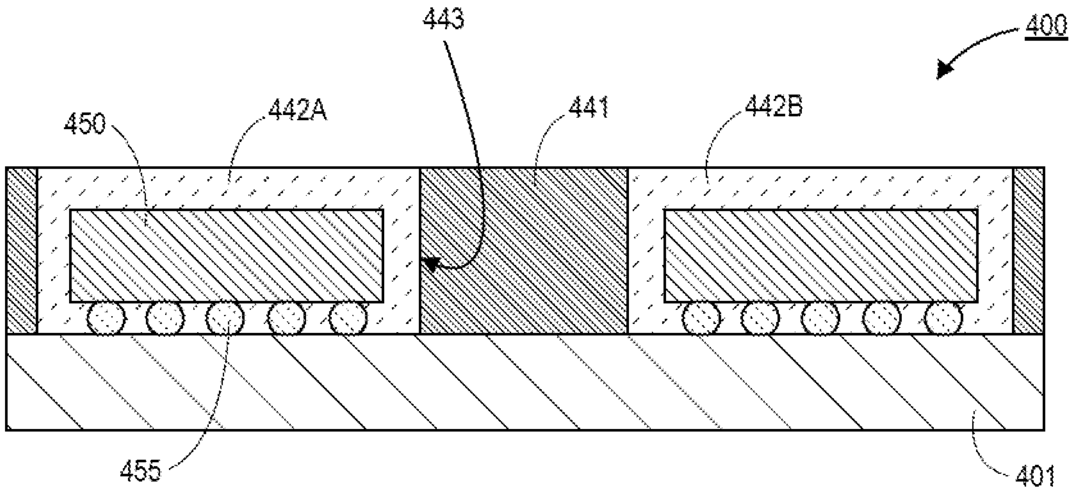
FIG. 4B is a cross-sectional illustration of an electronic package that comprises a MUF sheet with a first mold material and islands of a second mold material which surround each die, in accordance with an embodiment.

Referring now to FIG. 4B, a cross-sectional illustration of an electronic package 400 is shown, in accordance with an additional embodiment. In an embodiment, the electronic package 400 in FIG. 4B is substantially similar to the electronic package 400 in FIG. 4A, with the exception of the spacing between the pair of dies 450. More particularly, the spacing between the dies 450 is large enough that a portion of the first mold material 441 is provided between the dies 450. That is, a pair of islands of the second mold material 442A and 442B is provided on the package substrate 401. While two islands of the second mold material 442 are shown, it is to be appreciated that any number of islands of the second mold material 442 may be provided in the electronic package 400.

Figure 4C:
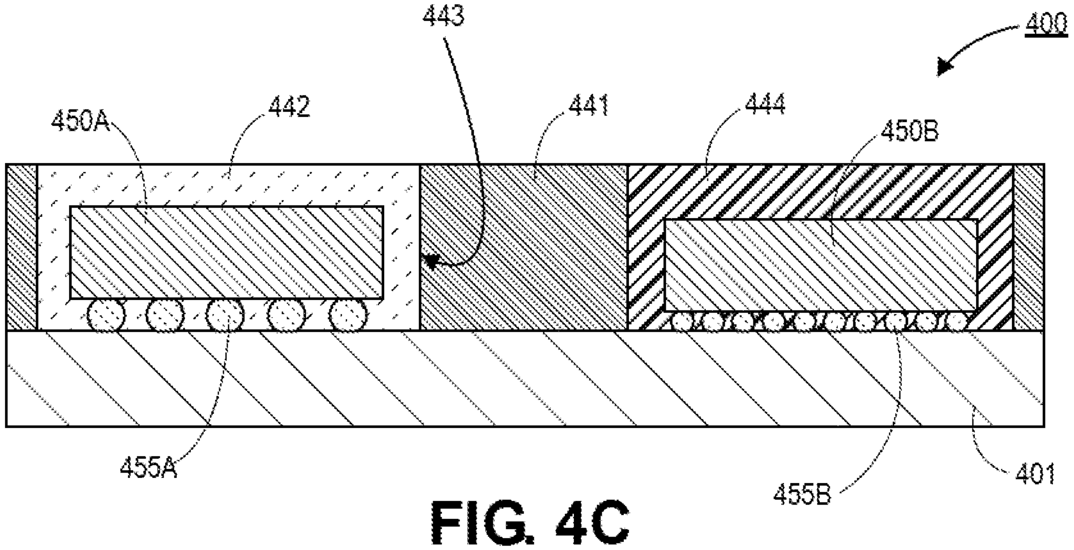
FIG. 4C is a cross-sectional illustration of an electronic package that comprises a MUF sheet with a first mold material, an island of a second mold material around a first die, and an island of a third mold material around a second die, in accordance with an embodiment.

Referring now to FIG. 4C, a cross-sectional illustration of an electronic package 400 is shown, in accordance with an additional embodiment. In an embodiment, the electronic package 400 in FIG. 4C may be substantially similar to the electronic package 400 in FIG. 4B, with the exception of one of the second mold material 442 islands being replaced by an island of a third mold material 444. The third mold material 444 may be a material composition that is different than the material composition of both the first mold material 441 and the second mold material 442. This may be beneficial when the second die 450B is different than the first die 450A. For example, the interconnect size and pitch of the interconnects 455B may be smaller than the size and pitch of the interconnects 455A. The smaller interconnects 455B may require an even lower viscosity material than what is used for the second mold material 442. Other material properties may also be different between the second mold material 442 and the third mold material 444.

Figure 5:
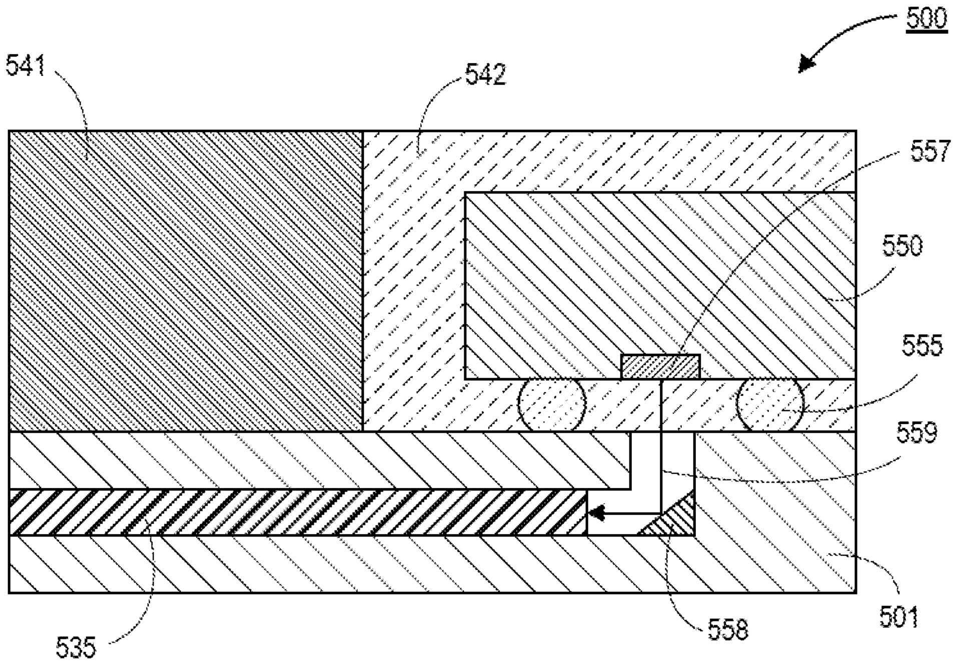
FIG. 5 is a cross-sectional illustration of an electronic package that includes an optical signaling solution where the light source passes through an optically clear mold material that surrounds the optical die, in accordance with an embodiment.

Referring now to FIG. 5, a cross-sectional illustration of a portion of a photonics package 500 is shown, in accordance with an embodiment. In an embodiment, the photonics package 500 may comprise a package substrate 501. The package substrate 501 may be substantially similar to the package substrate 401 described above, with the addition of optical interconnect structures. For example, an optical fiber 535 and a mirror 558 may be embedded in the package substrate.

In an embodiment, a PIC 550 is coupled to the package substrate 501 by interconnects 555. An opening between interconnects 555 is provided for a light source 557 (e.g., laser) or light detector (e.g., photodiode). An optical path 559 is provided from the light source 557 to the optical fiber 535. More particularly, the light source 557 passes through the second mold material 542. For example, the second mold material 542 may be an optically clear mold material. In contrast, the first mold material 541 may be optically opaque since there is no need to pass optical signals through the first mold material 541.

Referring now to FIGS. 6A-6E, a series of plan view illustrations depicting a process for forming a hybrid MUF sheet is shown, in accordance with an embodiment. In the embodiment shown in FIGS. 6A-6E a molding and embossing process is used to form the hybrid MUF sheet.

Figure 6A:
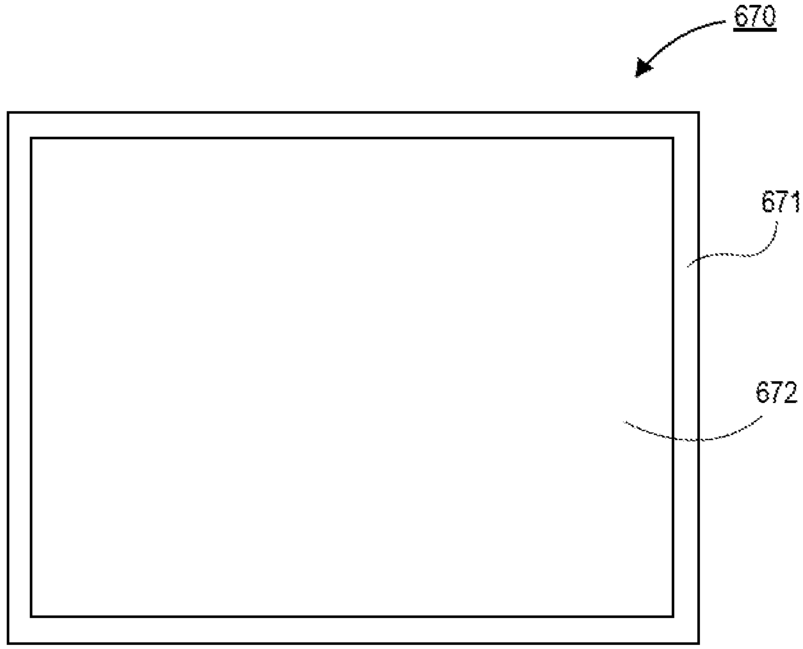
FIG. 6A is a plan view illustration of a frame used to form a hybrid MUF sheet, in accordance with an embodiment.

Referring now to FIG. 6A, a plan view illustration of a tray 670 is shown, in accordance with an embodiment. The tray 670 may include sidewalls 671 to confine a molding material over a base 672. The tray 670 may have any suitable form factor. For example, the tray 670 may be used to form panel-level sheets, quarter-panel level sheets, wafer-level sheets, or the like. The tray 670 may comprise any suitable material, such as, stainless steel.

Figure 6B:
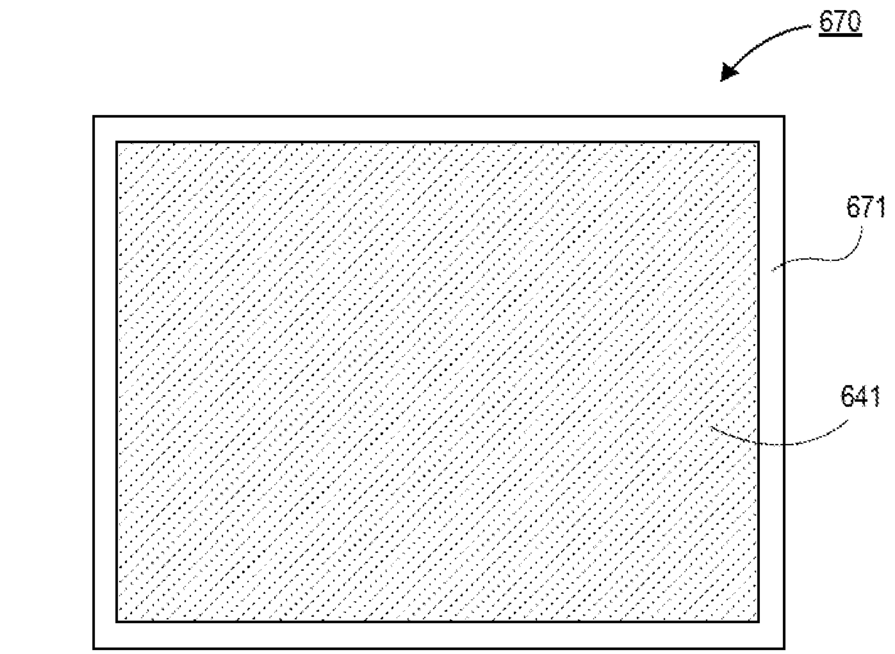
FIG. 6B is a plan view illustration of the frame after a first mold material is dispensed in the frame, in accordance with an embodiment.

Referring now to FIG. 6B, a plan view illustration of the tray 670 after a first mold material 641 is dispensed over the base 672 is shown, in accordance with an embodiment. The first mold material 641 may be dispensed into the tray 670 as a resin. In an embodiment, the resin may be cured or partially cured after it has been dispensed into the tray 670 in order to form a sheet of the first mold material 641.

Figure 6C:
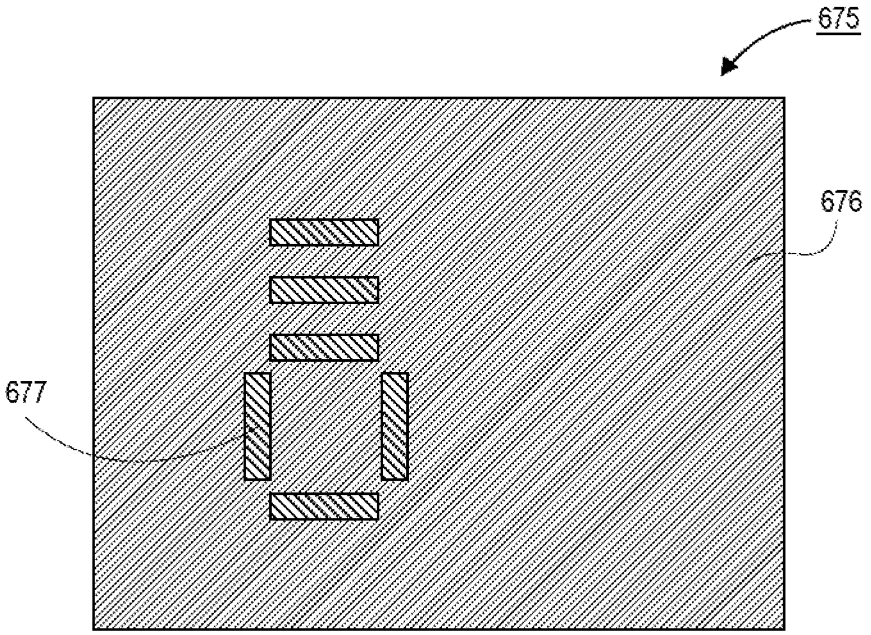
FIG. 6C is a plan view illustration of a stamp that is used to pattern the first mold material, in accordance with an embodiment.

Referring now to FIG. 6C, a plan view illustration of a stamp 675 is shown, in accordance with an embodiment. In an embodiment, the stamp 675 may have a flat surface 676 with one or more raised structures 677. The raised structures 677 are provided in locations where the second mold material is desired on the sheet of the first mold material 641. In an embodiment, the raised structures 677 have substantially vertical sidewalls. Though, some amount of draft or tapering may also be provided on the raised structures 677 in order to improve pattern transfer.

The stamp 675 may have a form factor that is substantially similar to the form factor of the tray 670. Though, in some embodiments, the stamp 675 may be pressed onto the sheet of the first mold material 641 multiple times. For example, the tray 670 may be a panel-level form factor, and the stamp 675 may be a quarter-panel form factor. In such an embodiment, the stamp 675 may be pressed into the sheet of the first mold material 641 four times.

Figure 6D:
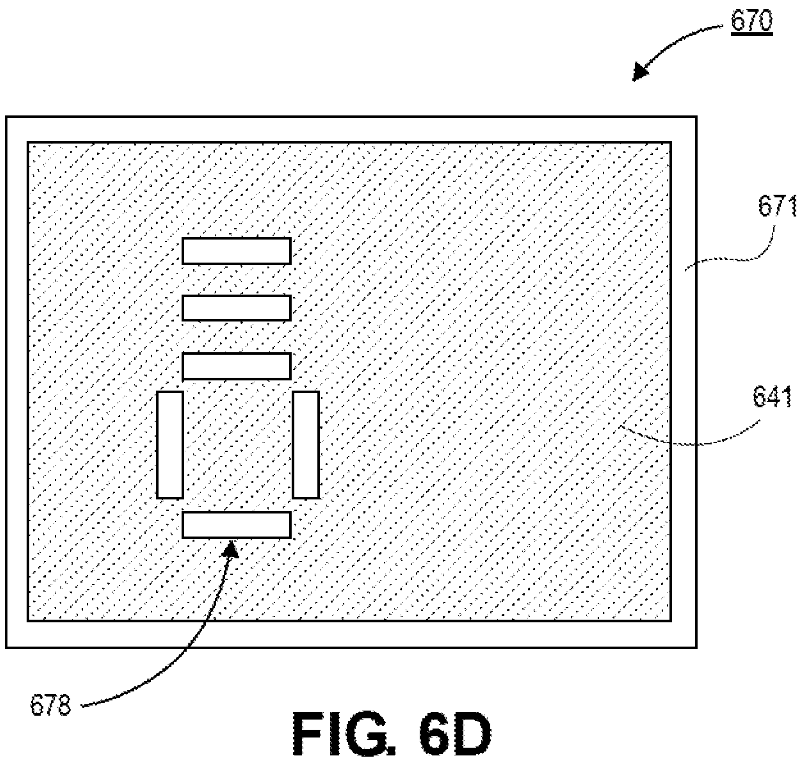
FIG. 6D is a plan view illustration of the frame after the first mold material is stamped to form openings, in accordance with an embodiment.

Referring now to FIG. 6D, a plan view illustration of the tray 670 after the sheet has been stamped or embossed is shown, in accordance with an embodiment. As shown, a plurality of holes 678 or openings are provided through (or at least partially into) the first mold material 641. The holes 678 may have substantially vertical sidewalls, or the holes may have a slight taper to match the draft of the stamp 675.

Figure 6E:
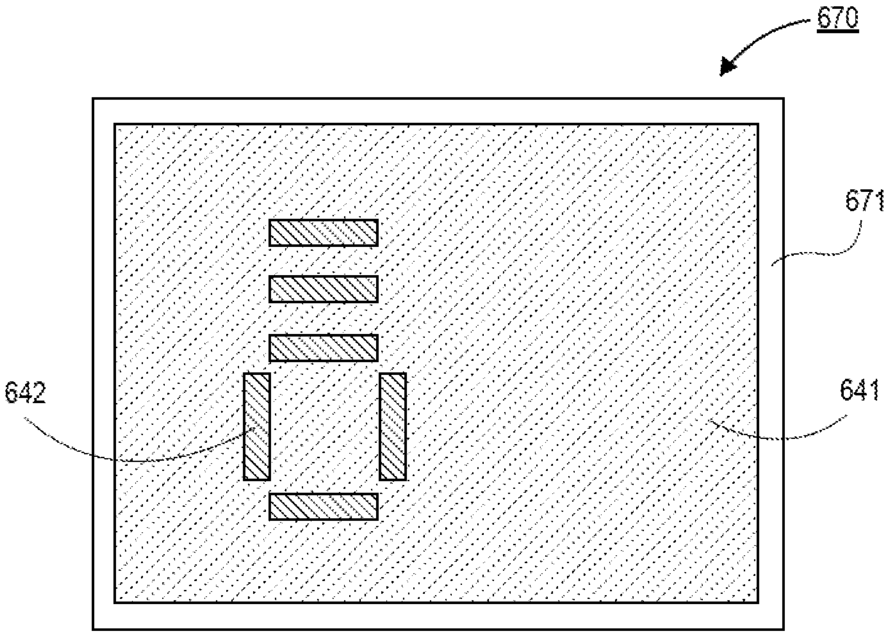
FIG. 6E is a plan view illustration of the frame after a second mold material is dispensed in the openings, in accordance with an embodiment.

Referring now to FIG. 6E, a plan view illustration of the tray 670 after the second mold material 642 is dispensed into the holes 678 is shown, in accordance with an embodiment. The second mold material 642 may have a different material composition than the first mold material 641. For example, a viscosity and/or CTE of the first mold material 641 may be different than the viscosity and/or CTE of the second mold material 642.

Figure 7:
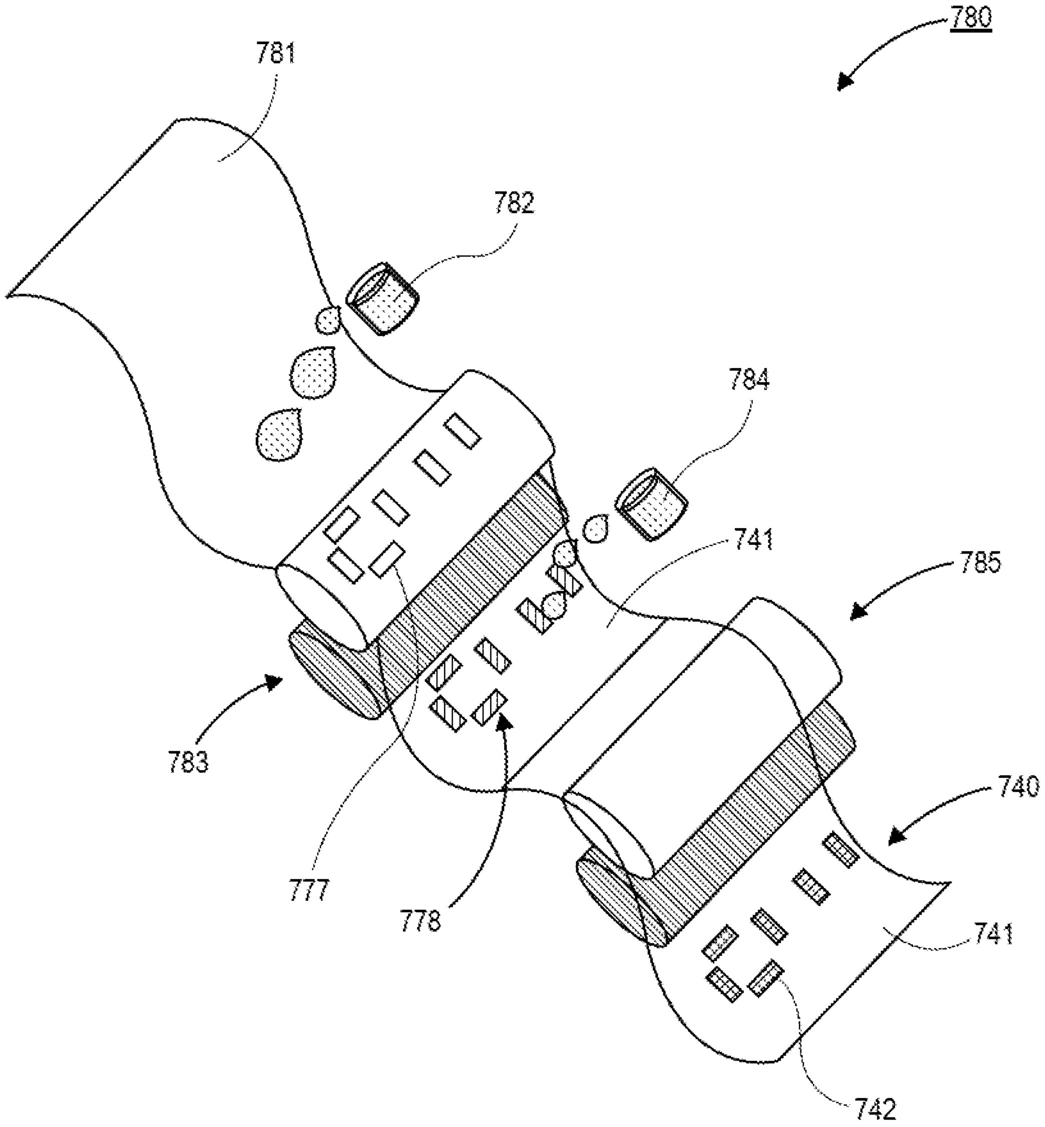
FIG. 7 is an illustration of a roll-to-roll process for forming hybrid MUF sheets, in accordance with an embodiment.

Referring now to FIG. 7, an illustration of a roll-to-roll manufacturing process for hybrid MUF sheets 780 is shown, in accordance with an embodiment. At the beginning, a sheet 781 may be provided. The sheet may be any suitable base material. For example, sheet 781 may be a polyethylene terephthalate (PET). Before the first rollers 783, a first resin 782 is dispensed onto the sheet 781. The first resin 782 may be used to form the first mold material 741. The first rollers 783 may include embossing structures 777. As the sheet 781 is fed through the first rollers 783, the first resin 782 is spread and patterned with the embossing structures 777 to form holes 778 in the first mold material 741. Between the first rollers 783 and the second rollers 785, a second resin 784 is dispensed. The second rollers 785 smooth the surface so that the second resin 784 is segregated to the holes 778 to form the second mold material 742.

Figure 8:
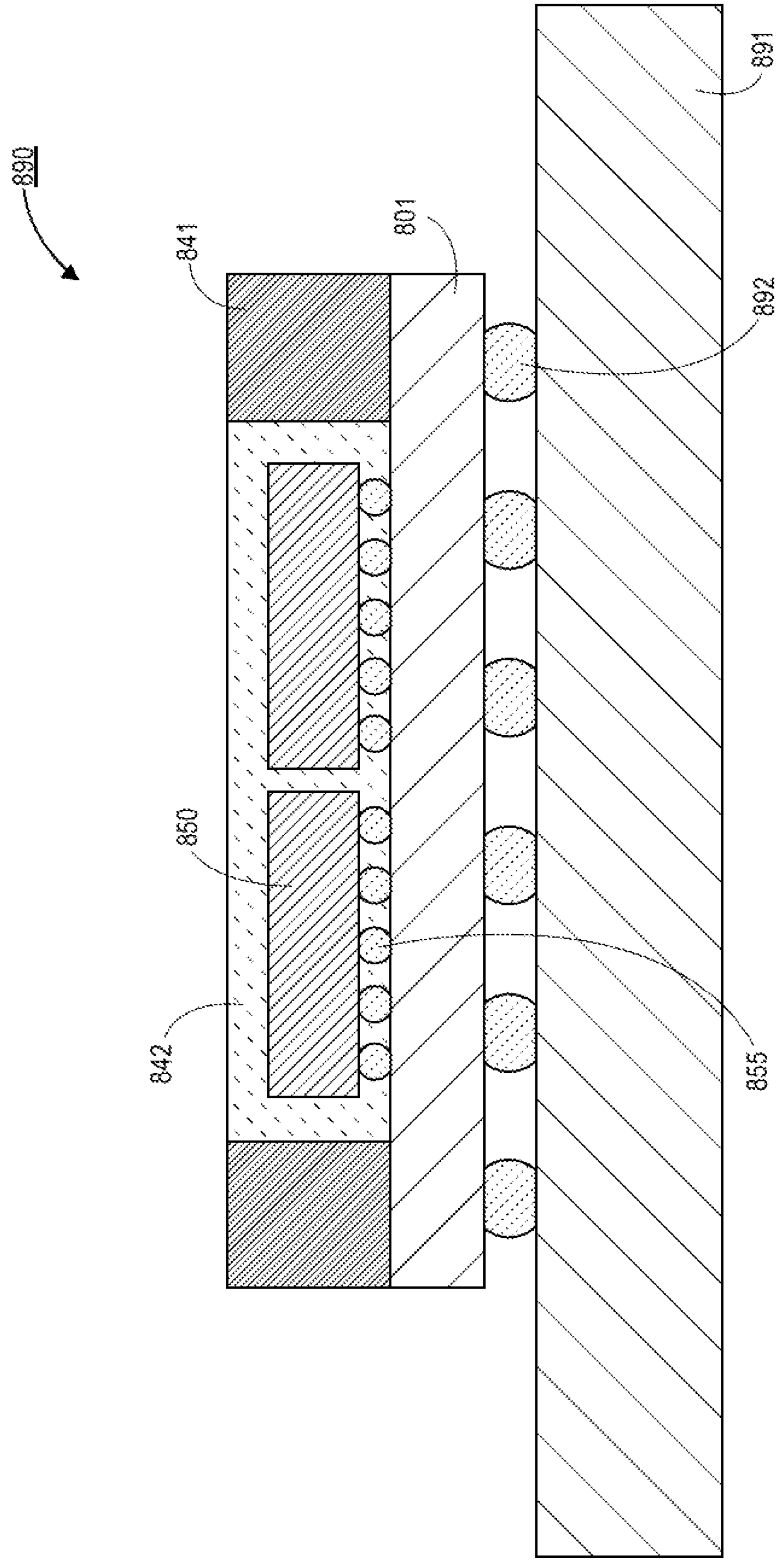
FIG. 8 is a cross-sectional illustration of a computing system that includes a hybrid MUF sheet for underfilling and overmolding a pair of dies, in accordance with an embodiment.

Referring now to FIG. 8, a cross-sectional illustration of a computing system 890 is shown, in accordance with an embodiment. In an embodiment, the computing system 890 may comprise a board 891, such as a printed circuit board (PCB). In an embodiment, the board 891 is coupled to a package substrate 801 by interconnects 892, such as solder balls, sockets, or the like. In an embodiment, one or more dies 850 are coupled to the package substrate 801 through interconnects 855.

In an embodiment, a hybrid MUF system is used to overmold and underfill the dies 850. For example, a first mold material 841 may be provided over the package substrate 801 adjacent to the dies 850, and a second mold material 842 may be provided over and under the dies 850. The second mold material 842 surrounds the interconnects 855. In an embodiment, the second mold material 842 is a different material composition than the first mold material 841. For example, the first mold material 841 may have a lower CTE than the second mold material 842, and the second mold material 842 may have a lower viscosity than the first mold material 841.

In the illustrated embodiment, the electronic package of the computing system 890 is similar to the electronic package 400 shown in FIG. 4A. Though, it is to be appreciated that any of the electronic packages or hybrid MUF systems described herein may be integrated into a similar computing system 890.

Figure 9:
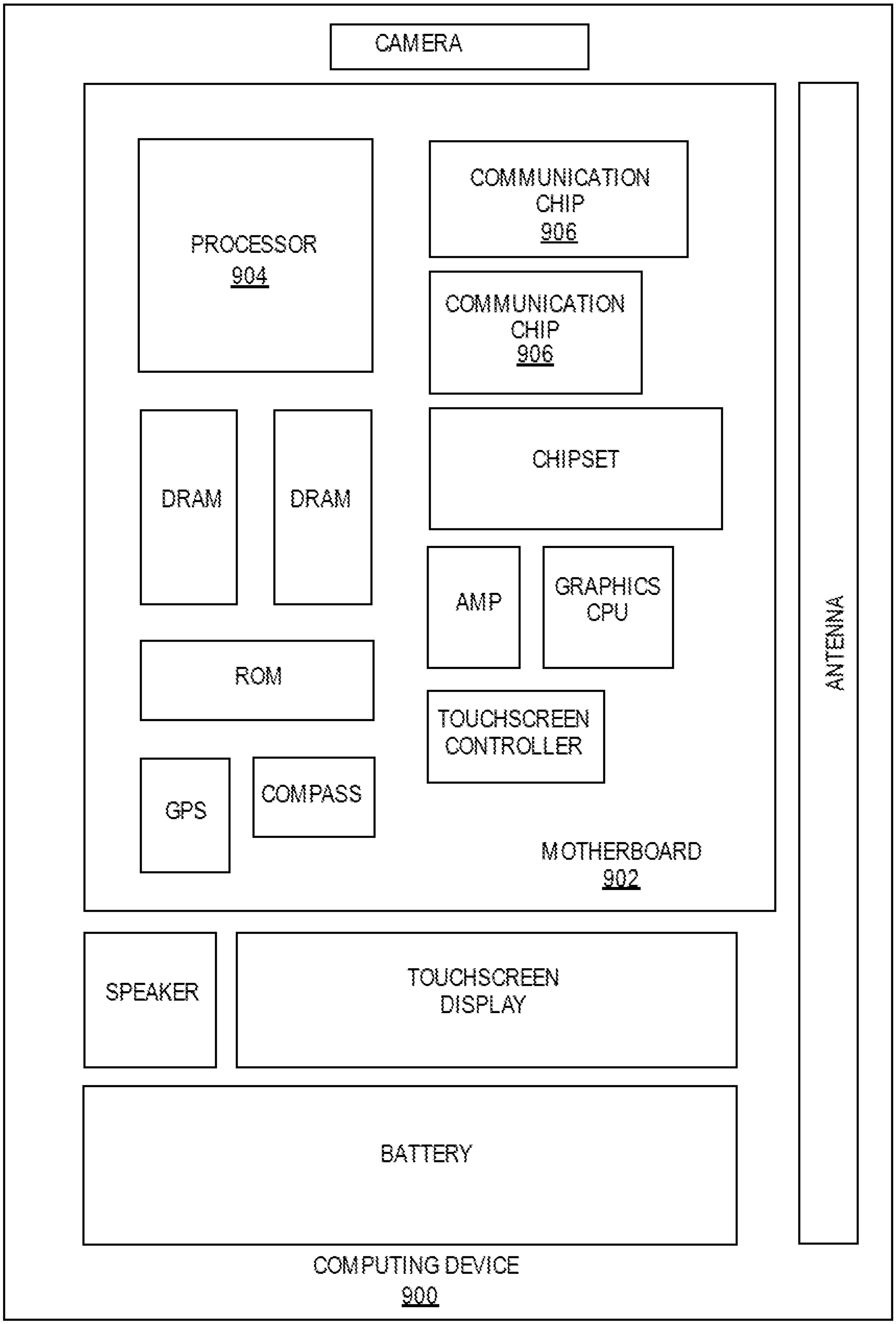
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic package that comprises a hybrid MUF sheet for overmolding and underfilling one or more dies, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic package that comprises a hybrid MUF sheet for overmolding and underfilling one or more dies, in accordance with embodiments described herein.

In an embodiment, the computing device 900 may be part of any apparatus. For example, the computing device may be part of a personal computer, a server, a mobile device, a tablet, an automobile, or the like. That is, the computing device 900 is not limited to being used for any particular type of system, and the computing device 900 may be included in any apparatus that may benefit from computing functionality.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die coupled to the package substrate by a plurality of interconnects; a first layer on the package substrate surrounding the die; and a second layer over and around the die, wherein the second layer underfills the plurality of interconnects, wherein the second layer has a different material composition than the first layer.

Example 2: the electronic package of Example 1, wherein an interface between the first mold material and the second mold material is substantially orthogonal to a top surface of the package substrate.

Example 3: the electronic package of Example 1 or Example 2, wherein the second layer has a rectangular footprint, and wherein the first layer is a frame around the rectangular footprint.

Example 4: the electronic package of Examples 1-3, wherein the first layer has a first coefficient of thermal expansion (CTE), and the second layer has a second CTE, wherein the first CTE is lower than the second CTE.

Example 5: the electronic package of Examples 1-4, wherein the first layer has a first filler loading percentage, and the second layer has a second filler loading percentage, wherein the second filler loading percentage is lower than the first filler loading percentage.

Example 6: the electronic package of Examples 1-5, wherein the first layer and the second layer have differences in one or more of filler size, filler loading, filler type, filler shape, filler hollow ratio, resin type, and additives.

Example 7: the electronic package of Examples 1-6, wherein the first layer and the second layer form a continuous sheet that is applied over the package substrate.

Example 8: the electronic package of Examples 1-7, further comprising: a second die over the package substrate that is coupled to the package substrate by a plurality of second interconnects; and wherein the second layer is over and around the second die and the plurality of second interconnects.

Example 9: the electronic package of Examples 1-8, further comprising: a third layer that is different than the first layer, wherein the third layer is spaced apart from the second layer by the first layer.

Example 10: the electronic package of Example 9, wherein a material composition of the second layer is substantially similar to a material composition of the third layer.

Example 11: the electronic package of Example 9, wherein a material composition of the second layer is different than a material composition of the third layer.

Example 12: the electronic package of Examples 1-11, wherein the electronic package is part of a computing system for a personal computer, a server, a mobile device, a tablet, or an automobile.

Example 13: a mold underfill (MUF) sheet, comprising: a first mold material with a first composition; an opening formed through the first mold material; and a second mold material in the opening, wherein the second mold material comprises a second composition.

Example 14: the MUF sheet of Example 13, wherein the first composition and the second composition have differences in one or more of filler size, filler loading, filler type, filler shape, filler hollow ratio, resin type, and additives.

Example 15: the MUF sheet of Example 13 or Example 14, wherein the opening has substantially vertical sidewalls.

Example 16: the MUF sheet of Examples 13-15, wherein the opening has a rectangular footprint.

Example 17: the MUF sheet of Examples 13-16, wherein the MUF sheet is part of a roll of a plurality of MUF sheets.

Example 18: a computing system, comprising: a board; a package substrate coupled to the board; a die coupled to the package substrate; and a mold underfill (MUF) disposed over the package substrate and the die, wherein the MUF comprises: a first mold material over and around the die; and a second mold material surrounding the first mold material.

Example 19: the computing system of Example 18, wherein the first mold material has a first coefficient of thermal expansion (CTE), and wherein the second mold material has a second CTE that is less than the first CTE.

Example 20: the computing system of Example 18 or Example 19, wherein the computing system is part of a personal computer, a server, a mobile device, a tablet, or an automobile.

What is claimed is:

1. An electronic package, comprising:

a package substrate;

a die coupled to the package substrate by a plurality of interconnects;

a first layer on the package substrate surrounding the die; and a second layer over and around the die, wherein the second layer underfills the plurality of interconnects, wherein the second layer has a different material composition than the first layer, and wherein the second layer laterally separates an entirety of the die from the first layer.

2. The electronic package of claim 1, wherein an interface between the first layer and the second layer is substantially orthogonal to a top surface of the package substrate.

3. The electronic package of claim 1, wherein the second layer has a rectangular footprint, and wherein the first layer is a frame around the rectangular footprint.

4. The electronic package of claim 1, wherein the first layer has a first coefficient of thermal expansion (CTE), and the second layer has a second CTE, wherein the first CTE is lower than the second CTE.

5. The electronic package of claim 1, wherein the first layer has a first filler loading percentage, and the second layer has a second filler loading percentage, wherein the second filler loading percentage is lower than the first filler loading percentage.

6. The electronic package of claim 1, wherein the first layer and the second layer have differences in one or more of filler size, filler loading, filler type, filler shape, filler hollow ratio, resin type, and additives.

7. The electronic package of claim 1, wherein the first layer and the second layer form a continuous sheet that is applied over the package substrate.

8. The electronic package of claim 1, further comprising:

a second die over the package substrate that is coupled to the package substrate by a plurality of second interconnects; and wherein the second layer is over and around the second die and the plurality of second interconnects.

9. The electronic package of claim 1, further comprising:

a third layer that is different than the first layer, wherein the third layer is spaced apart from the second layer by the first layer.

10. The electronic package of claim 9, wherein a material composition of the second layer is substantially similar to a material composition of the third layer.

11. The electronic package of claim 9, wherein a material composition of the second layer is different than a material composition of the third layer.

12. The electronic package of claim 1, wherein the electronic package is part of a computing system for a personal computer, a server, a mobile device, a tablet, or an automobile.

13. A mold underfill (MUF) sheet, comprising:

a first mold material with a first composition;

an opening formed through the first mold material; and a second mold material in the opening, wherein the second mold material comprises a second composition, and wherein the second mold material laterally separates an entirety of the opening from the first mold material.

14. The MUF sheet of claim 13, wherein the first composition and the second composition have differences in one or more of filler size, filler loading, filler type, filler shape, filler hollow ratio, resin type, and additives.

15. The MUF sheet of claim 13, wherein the opening has substantially vertical sidewalls.

16. The MUF sheet of claim 13, wherein the opening has a rectangular footprint.

17. The MUF sheet of claim 13, wherein the MUF sheet is part of a roll of a plurality of MUF sheets.

18. A computing system, comprising:

a board;

a package substrate coupled to the board;

a die coupled to the package substrate; and a mold underfill (MUF) disposed over the package substrate and the die, wherein the MUF comprises:

a first mold material over and around the die; and a second mold material surrounding the first mold material, and wherein the third mold material laterally separates an entirety of the die from the second mold material.

19. The computing system of claim 18, wherein the first mold material has a first coefficient of thermal expansion (CTE), and wherein the second mold material has a second CTE that is less than the first CTE.

20. The computing system of claim 18, wherein the computing system is part of a personal computer, a server, a mobile device, a tablet, or an automobile.

* * * * *